United States Patent
Cheng et al.

(10) Patent No.: US 10,886,367 B2
(45) Date of Patent: Jan. 5, 2021

(54) FORMING FINFET WITH REDUCED VARIABILITY

(71) Applicant: International Business Machines Corporation, Armonk, NY (US)

(72) Inventors: Kangguo Cheng, Schenectady, NY (US); Juntao Li, Cohoes, NY (US); Zhenxing Bi, Niskayuna, NY (US); Dexin Kong, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/250,585

(22) Filed: Jan. 17, 2019

(65) Prior Publication Data
US 2020/0235204 A1     Jul. 23, 2020

(51) Int. Cl.
| H01L 29/06 | (2006.01) |
|---|---|
| H01L 29/78 | (2006.01) |
| H01L 29/66 | (2006.01) |
| H01L 21/8238 | (2006.01) |
| H01L 21/3065 | (2006.01) |
| H01L 21/308 | (2006.01) |
| H01L 29/786 | (2006.01) |

(52) U.S. Cl.
CPC ...... *H01L 29/0649* (2013.01); *H01L 21/3065* (2013.01); *H01L 21/3081* (2013.01); *H01L 21/823807* (2013.01); *H01L 29/66666* (2013.01); *H01L 29/7827* (2013.01); *H01L 29/78642* (2013.01)

(58) Field of Classification Search
CPC ............ H01L 29/0649; H01L 21/3065; H01L 21/3081; H01L 29/66666; H01L 29/7827; H01L 29/78642
See application file for complete search history.

(56) References Cited

U.S. PATENT DOCUMENTS

| 7,198,995 B2 | 4/2007 | Chidambarrao et al. |
|---|---|---|
| 7,892,912 B2 | 2/2011 | Kim |
| 8,841,726 B2 | 9/2014 | Leobandung |
| 9,064,932 B1 | 6/2015 | Pham et al. |
| 9,153,693 B2 | 10/2015 | Yu et al. |
| 9,240,412 B2 | 1/2016 | Xie et al. |
| 9,728,635 B1 | 8/2017 | Cheng et al. |
| 9,972,494 B1 | 5/2018 | Bentley et al. |
| 2016/0056181 A1 | 2/2016 | Anderson et al. |

(Continued)

*Primary Examiner* — Nathan W Ha
(74) *Attorney, Agent, or Firm* — Scully, Scott, Murphy & Presser, P.C.; L. Jeffrey Kelly Esq.

(57) ABSTRACT

A semiconductor structure is provided that includes active semiconductor fins that have a uniform fin channel height. The uniform fin channel height is achieved by forming semiconductor fins (active and sacrificial) on an entirety of semiconductor substrate thus there is no loading effect during a subsequently performed dielectric etch step which can lead to fin channel height variation and ultimately variation in device characteristics. A trench isolation structure is located adjacent to the active semiconductor fins. The trench isolation structure includes at least one dielectric plug having a second width and a dielectric pillar having a first width located on each side of the at least one dielectric plug. The second width of the at least one dielectric plug is less than the first width of each dielectric pillar, yet equal to a width of each semiconductor fin.

7 Claims, 4 Drawing Sheets

(56) References Cited

U.S. PATENT DOCUMENTS

| | | | |
|---|---|---|---|
| 2016/0149036 A1* | 5/2016 | Huang | H01L 27/0886 |
| | | | 257/401 |
| 2016/0372559 A1* | 12/2016 | Zang | H01L 29/0649 |
| 2018/0097091 A1 | 4/2018 | Cheng et al. | |
| 2018/0151442 A1* | 5/2018 | Tsai | H01L 21/82345 |
| 2018/0175028 A1* | 6/2018 | Zhang | H01L 29/165 |
| 2018/0240699 A1* | 8/2018 | Chan | H01L 21/76816 |
| 2018/0240889 A1* | 8/2018 | Chi | H01L 21/3105 |
| 2018/0277386 A1* | 9/2018 | Sherpa | H01L 21/3065 |
| 2019/0051731 A1* | 2/2019 | Liou | H01L 27/0924 |
| 2019/0148235 A1* | 5/2019 | Wang | H01L 21/3086 |
| | | | 257/401 |
| 2019/0206872 A1* | 7/2019 | Kim | H01L 27/10814 |
| 2019/0341472 A1* | 11/2019 | Lee | H01L 21/0245 |
| 2019/0355721 A1* | 11/2019 | Jambunathan | H01L 29/0649 |
| 2020/0119182 A1* | 4/2020 | Chang | H01L 29/0653 |

\* cited by examiner

US 10,886,367 B2

FORMING FINFET WITH REDUCED VARIABILITY

BACKGROUND

The present application relates to a semiconductor structure and a method of forming the same. More particularly, the present application relates to a semiconductor structure including a plurality of semiconductor fins that have a uniform fin channel height, and a method of forming the same.

Semiconductor fin field effect transistors (i.e., FinFETs) have become a mainstream complementary metal oxide semiconductor (CMOS) technology. In typical FinFET fabrication, the semiconductor fins are formed by patterning an upper semiconductor material portion of a substrate. The trenches between each of the semiconductor fins are then filled with a dielectric material such as, for example, an oxide. The dielectric material is then recessed to reveal the channel of each semiconductor fin. The recessed dielectric material that remains between each of the semiconductor fins provides an isolation structure.

Due to the micro-loading effect (across-chip fin density variation), non-uniformity in the dielectric material recess occurs resulting in fin channel height variation. Fin channel height variation translates to effective device width variation and thus the undesirable variation in device characteristics. There is thus a need to provide a method that is capable of reducing the fin channel height variation which, in turn, can mitigate the variation of device characteristics of FinFETs.

SUMMARY

A semiconductor structure is provided that includes active semiconductor fins that have a uniform fin channel height. The uniform fin channel height is achieved by forming semiconductor fins (active and sacrificial) on an entirety of semiconductor substrate thus there is no loading effect during a subsequently performed dielectric etch step which can lead to fin channel height variation and ultimately variation in device characteristics. A trench isolation structure is located adjacent to the active semiconductor fins. The trench isolation structure includes at least one dielectric plug, which is formed in a gap created by removing each sacrificial semiconductor fin, having a second width and a dielectric pillar having a first width located on each side of the at least one dielectric plug. The second width of the at least one dielectric plug is less than the first width of each dielectric pillar, yet equal to a width of each semiconductor fin.

In one aspect of the present application, a semiconductor structure is provided. In one embodiment, the semiconductor structure includes a plurality of semiconductor fins extending upward from a surface of a semiconductor substrate, wherein each semiconductor fin has a uniform channel height. A trench isolation structure is located adjacent to the plurality of semiconductor fins. The trench isolation structure includes at least one dielectric plug having a second width and a dielectric pillar having a first width located on each side of the at least one dielectric plug. In accordance with the present application, the second width of the at least one dielectric plug is less than the first width of each dielectric pillar, yet equal to a width of each semiconductor fin.

In another aspect of the present application, a method of forming a semiconductor structure is provided. In one embodiment, the method includes forming a plurality of semiconductor fins extending upward from a surface of a semiconductor substrate, wherein each semiconductor fin is spaced apart by a trench. A dielectric pillar is formed within a bottom portion of each trench. Next, a fin mask is formed protecting a first set of semiconductor fins, while leaving a second set of semiconductor fins unprotected. The second set of semiconductor fins are then removed to create at least one gap that is located between a neighboring pair of dielectric pillars. The fin mask is removed to physically expose the first set of semiconductor fins, and thereafter a dielectric plug is formed within the at least one gap.

DETAILED DESCRIPTION

Figure 1:
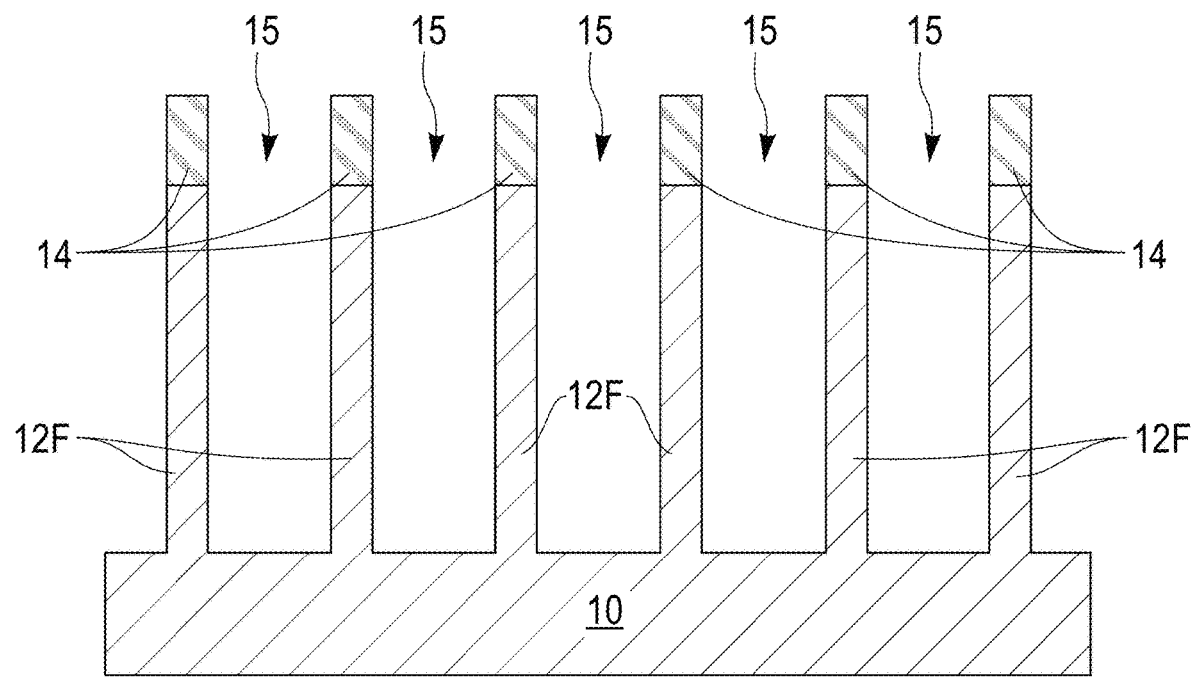
FIG. 1 is a cross sectional view of an exemplary semiconductor structure of the present application and during an early stage of fabrication, the exemplary structure includes a plurality of semiconductor fins extending upward from a surface of a semiconductor substrate, each semiconductor fin is capped with a dielectric hard mask cap.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including a plurality of semiconductor fins 12F (active and sacrificial) extending upward from a surface of a semiconductor substrate 10. Each semiconductor fin 12F is capped with a dielectric hard mask cap 14. In the present application, the semiconductor fins 12F are formed everywhere atop the semiconductor substrate 10.

As used herein, a "semiconductor fin" refers to a semiconductor material portion that includes a pair of vertical sidewalls that are parallel to each other. As used herein, a surface is "vertical" if there exists a vertical plane from which the surface does not deviate by more than three times the root mean square roughness of the surface. In one embodiment, each semiconductor fin 12F has a height from 20 nm to 200 nm, and a width from 5 nm to 30 nm. Other heights and/or widths that are lesser than, or greater than, the ranges mentioned herein can also be used in the present application. Each semiconductor fin 12F is spaced apart from its nearest neighboring semiconductor fin 12F by a pitch of from 20 nm to 100 nm; the pitch is measured from one point of one semiconductor fin to the exact point on a neighboring semiconductor fin. Also, each semiconductor fin 12F is oriented parallel to each other. A trench 15 is located present between each neighboring pair of semiconductor fins 12F.

The semiconductor substrate 10 may be composed of a remaining portion of a base semiconductor substrate (not shown). The semiconductor substrate 10 may be composed of one or more semiconductor materials having semiconductor properties. Examples of semiconductor materials that may provide the semiconductor substrate 10 include silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

Each semiconductor fin 12F may be composed of one of the semiconductor materials mentioned above for the semiconductor substrate 10. In one embodiment, the semiconductor fins 12F and the semiconductor substrate 10 are composed entirely of a same semiconductor material. In such an embodiment, and as shown in the drawings of the present application, no material interface is present between the semiconductor fins 12F and the semiconductor substrate 10. In one example, the semiconductor fins 12F and the semiconductor substrate 10 are composed entirely of silicon. In another embodiment, the semiconductor fins 12F are composed of a different semiconductor material than the semiconductor substrate 10. In such an embodiment (not shown in the drawings), a material interface would exist between the bottommost surface of each semiconductor fin 12F and the topmost surface of the semiconductor substrate 10. In one example, the semiconductor fins 12F are composed of a silicon germanium alloy or a III-V compound semiconductor, while the semiconductor substrate 10 is composed of silicon.

Each dielectric hard mask cap 14 is composed of a dielectric hard mask material such as, for example, silicon dioxide, silicon nitride and/or silicon oxynitride. In one example, silicon nitride is employed as the dielectric hard mask material of each dielectric hard mask cap 14. As is shown, the dielectric hard mask cap 14 has sidewall surfaces that are vertically aligned to sidewall surfaces of the underlying semiconductor fin 12F.

The exemplary semiconductor structure can be formed by first providing a dielectric hard mask layer (not shown) onto a surface of a base semiconductor substrate (not shown). The base semiconductor substrate is typically a bulk semiconductor substrate. By "bulk" it is meant that the base semiconductor substrate is entirely composed of at least one semiconductor material having semiconducting properties. The base semiconductor substrate may include at least one of the semiconductor materials mentioned above for semiconductor substrate 10, and the hard mask layer may include one of the dielectric hard mask materials mentioned above for the hard mask caps 14.

The dielectric hard mask layer may be formed utilizing a deposition process such as, for example, chemical vapor deposition (CVD) or plasma enhanced chemical vapor deposition (PECVD). In some embodiments, the hard mask layer may be formed by a thermal growth process such as, for example, thermal oxidation and/or thermal nitridation. In yet other embodiments, the dielectric hard mask layer may be formed utilizing a combination of, and in any order, a deposition process and a thermal growth process. The dielectric hard mask layer is a continuous layer (without any breaks or gaps) whose thickness may be from 20 nm to 100 nm. Other thicknesses that are lesser than, or greater than the aforementioned thicknesses values may also be employed as the thickness of the dielectric hard mask layer. The dielectric hard mask layer can have a single material (e.g., silicon nitride) or a stack of multiple materials such as silicon nitride on top of silicon oxide.

The dielectric hard mask layer and an upper semiconductor material portion of the base semiconductor substrate are then patterned to provide the exemplary semiconductor structure shown in FIG. 1. In one embodiment, the patterning of the dielectric hard mask layer and the upper semiconductor material portion of the base semiconductor substrate may include lithography and etching. The lithographic process includes forming a photoresist (not shown) atop a material or material stack to be patterned, exposing the photoresist to a desired pattern of radiation, and developing the exposed photoresist utilizing a conventional resist developer. The photoresist may be a positive-tone photoresist, a negative-tone photoresist or a hybrid-tone photoresist. The etching process (i.e., pattern transfer etch) includes a dry etching process (such as, for example, reactive ion etching, ion beam etching, plasma etching or laser ablation), and/or a wet chemical etching process. In some embodiments, the patterned photoresist is removed from the structure immediately after the pattern has been transferred into the dielectric hard mask layer. In other embodiments, the patterned photoresist is removed from the structure after the pattern has been transferred into both the dielectric hard mask layer and the upper semiconductor material portion of the base semiconductor substrate. In either embodiment, the patterned photoresist may be removed utilizing a conventional photoresist stripping process such as, for example, ashing.

In another embodiment, the patterning of the dielectric hard mask layer and the upper semiconductor material portion of the base semiconductor substrate may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, amorphous carbon, tungsten, or any other suitable material. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer (not shown) on each sidewall of each mandrel structure. The spacer can be formed by deposition of a spacer material and then etching the deposited spacer material. The spacer material may comprise any material having an etch selectivity that differs from the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

In yet a further embodiment, the patterning of the dielectric hard mask layer and the upper semiconductor material portion of the base semiconductor substrate may include a direct self-assembly (DSA) process in which a copolymer that is capable of direct self-assembly is used. Other suitable patterning techniques: self-aligned double patterning (SADP), self-aligned multiple patterning (SAMP), self-aligned quadruple patterning (SAQP) can be used. The semiconductor fins are shown perfectly vertical in FIG. 1. The semiconductor fins can also have other profiles such as a tapered profile.

Figure 2:
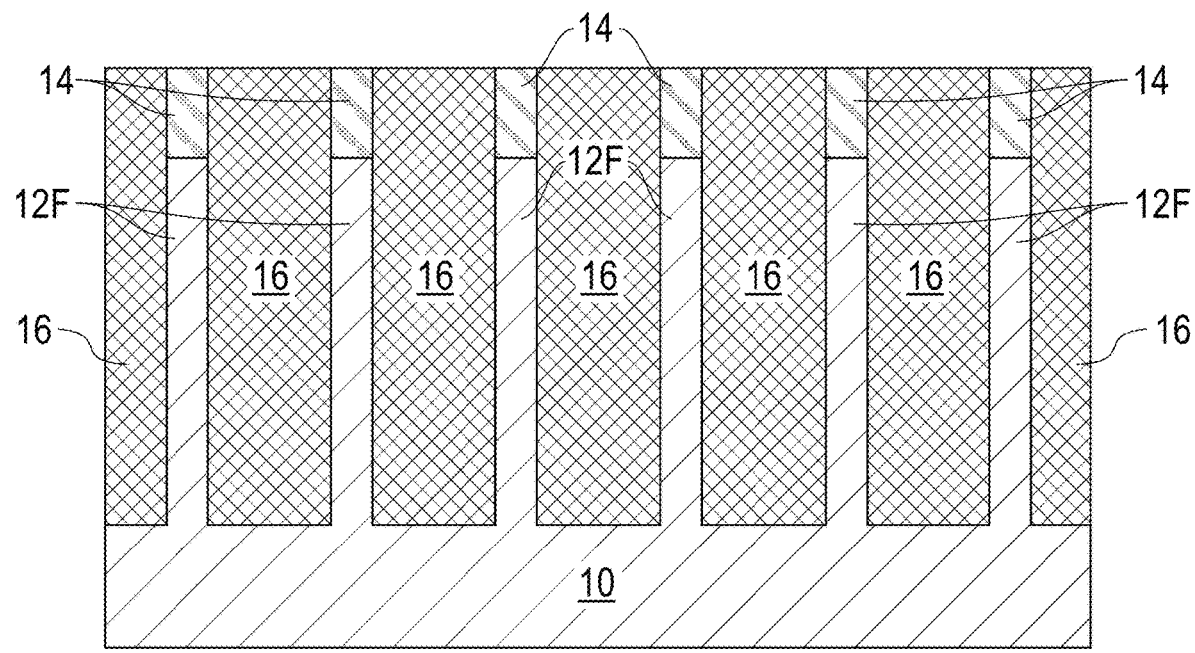
FIG. 2 is a cross sectional view of the exemplary semiconductor structure of FIG. 1 after forming a first dielectric material layer having a topmost surface that is coplanar with a topmost surface of each dielectric hard mask cap.

Referring now to FIG. 2, there is illustrated the exemplary semiconductor structure of FIG. 1 after forming a first dielectric material layer 16 having a topmost surface that is coplanar with a topmost surface of each dielectric hard mask cap 14. The first dielectric material layer 16 is formed within the trenches 15 that are provided between each of the semiconductor fins 12F and on an exposed surface of the semiconductor substrate 10.

The first dielectric material layer 16 is composed of a dielectric material that is compositionally different from the dielectric hard mask material that provides each dielectric hard mask cap 14. In one embodiment, the first dielectric material layer 16 may be composed of silicon dioxide, while each dielectric hard mask cap 14 is composed of silicon nitride. The first dielectric material layer 16 may be formed utilizing a deposition process including, for example chemical vapor deposition (CVD) or plasma enhanced chemical vapor deposition (PECVD). In some embodiments, and following the deposition of the dielectric material that provides the first dielectric material layer 16, a planarization process such as, for example, chemical mechanical polishing (CMP) and/or grinding may be used to provide the exemplary semiconductor structure shown in FIG. 2. The first dielectric material layer 16 can comprise a single material (e.g., silicon oxide) or multiple materials (e.g., silicon nitride liner on the semiconductor fin sidewalls and the rest of the trench can be filled with silicon oxide).

Figure 3:
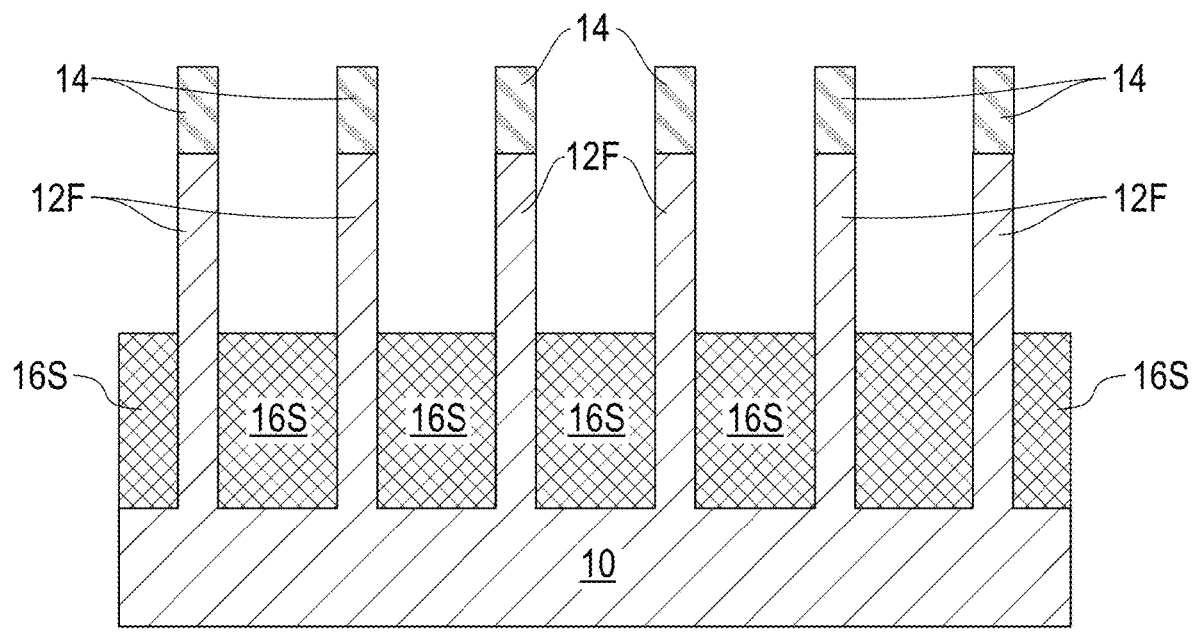
FIG. 3 is a cross sectional view of the exemplary semiconductor structure of FIG. 2 after recessing the first dielectric material layer to provide dielectric pillars having a uniform height.

Referring now to FIG. 3, there is illustrated the exemplary semiconductor structure of FIG. 2 after recessing the first dielectric material layer 16 to provide dielectric pillars 16S, whose height is less than the height of the semiconductor fins 12F. Each dielectric pillar 16S is composed of dielectric material (i.e., first dielectric material) that provides the first dielectric material layer 16. Since the semiconductor fins 12F are formed everywhere, there is no loading effect. Thus, the first dielectric material layer 16 can be recessed uniformly to form dielectric pillars 16S which have a uniform height and repeat in a periodic manner.

The recessing of the first dielectric material layer 16 is performed utilizing an etching process that is selective in removing the first dielectric material layer 16 relative to the dielectric hard mask caps 14 and the semiconductor fins 12F. In one example and when the first dielectric material layer 16 is composed of silicon dioxide, the recessing of the first dielectric material layer 16 can be performed utilizing an oxide plasma etch, a chemical oxide etch, or a wet etch process comprising hydrofluoric acid. Non-limiting range of the exposed semiconductor fins after the recess is from 20 nm to 100 nm.

Figure 4:
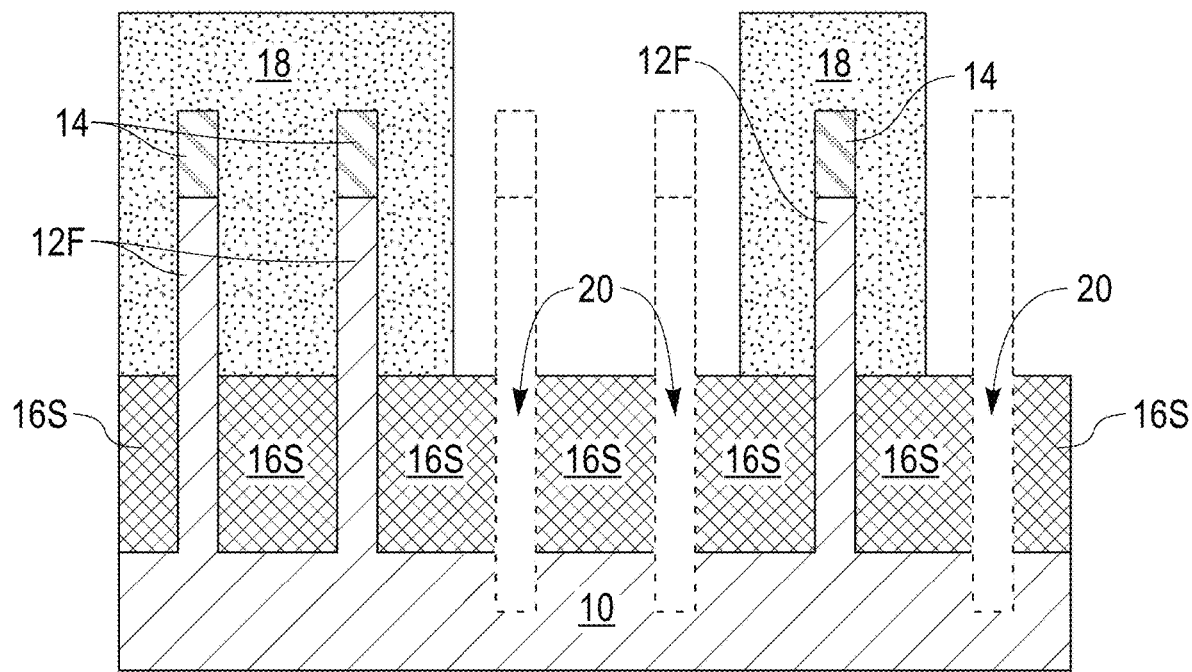
FIG. 4 is a cross sectional view of the exemplary semiconductor structure of FIG. 3 after forming a fin mask protecting a first set of dielectric hard mask capped semiconductor fins, and removing a second set of dielectric hard mask capped semiconductor fins that is not protected by the fin mask to create at least one gap between a neighboring pair of dielectric pillars.

Referring now to FIG. 4, there is illustrated the exemplary semiconductor structure of FIG. 3 after forming a fin mask 18 protecting a first set of dielectric hard mask capped semiconductor fins (14/12F), and removing a second set of dielectric hard mask capped semiconductor fins (14/12F) that is not protected by the fin mask 18 to create at least one gap 20 in the area previously including the second set of semiconductor fins 12. Each gap 20 is flanked on each side by one of the dielectric pillars 16S. The first set includes active semiconductor fins, while the second set includes sacrificial semiconductor fins. In FIG. 4, dotted lines are shown to represent an area that previously included a sacrificial semiconductor fin. Each gap 20 that is formed has a width that is equal to the width of the removed 'sacrificial' semiconductor fin 12F of the second set of dielectric hard mask cap semiconductor fins.

The fin mask 18 may include any conventional fin mask material such as, for example, a photoresist, an optical planarization layer (OPL), or amorphous carbon. The fin mask material is compositionally different from the first dielectric material layer 16 and each dielectric hard mask cap 14. The fin mask 18 may be formed by deposition of the fin mask material and thereafter patterning the fin mask material by at least photolithography. The patterning step may also include an etching step.

The 'sacrificial' dielectric hard mask capped semiconductor fins (14/12F) that are not protected by the fin mask 18 (i.e., the second set of dielectric hard mask capped semiconductor fins) can be removed by first removing each physically exposed dielectric hard mask cap 14, and then second removing each physically exposed semiconductor fin 12F. The first removing step may include a first etching process, and the second removing step may include a second etching process that is different from the first etching process.

In some embodiments and as is shown in FIG. 4, each gap 20 may extend beneath a topmost surface of the semiconductor substrate 10. In yet other embodiments, each gap 20 may stop on a topmost surface of the semiconductor substrate 10.

Figure 5:
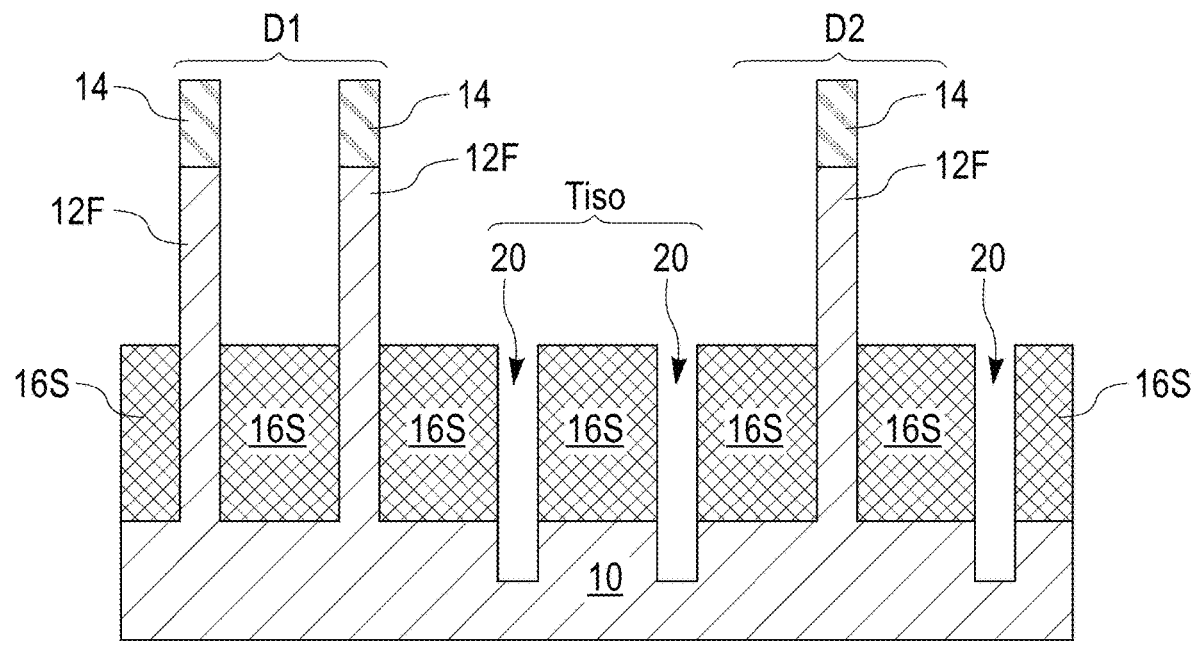
FIG. 5 is a cross sectional view of the exemplary semiconductor structure of FIG. 4 after removing the fin mask.

Referring now to FIG. 5, there is illustrated the exemplary semiconductor structure of FIG. 4 after removing the fin mask 18. The removal of the fin mask 18 physically exposes each dielectric hard mask capped semiconductor fin (14/12F) of the first set of dielectric hard mask capped semiconductor fins. The remaining dielectric hard mask capped semiconductor fins (14/12F) of the first set of dielectric hard mask capped semiconductor fins are present in a device region of the exemplary semiconductor structure. Thus, the semiconductor fins of the first set are active semiconductor fins. In the illustrated embodiment, two dielectric hard mask capped semiconductor fin (14/12F) are physically exposed in a first device region, D1, while a single dielectric hard mask capped semiconductor fin (14/12F) is physically exposed in a second device region, D2. The number of dielectric hard mask capped semiconductor fins (14/12F) in each device area may vary as long as at least one dielectric hard mask cap semiconductor fin (14/12F) is present in each device area. The area located between the device regions, D1 and D2, may be referred to herein as a trench isolation region, Tiso. The number of gaps 20 within the Tiso may vary as long as at least one gap 20 is formed.

The fin mask 18 may be removed utilizing any conventional material removal process. In one example, a resist stripping process such as, for example, ashing, is used to remove the fin mask 18 from the structure. In another example, an etching process that is selective in removing the fin mask 18 can be employed.

Figure 6:
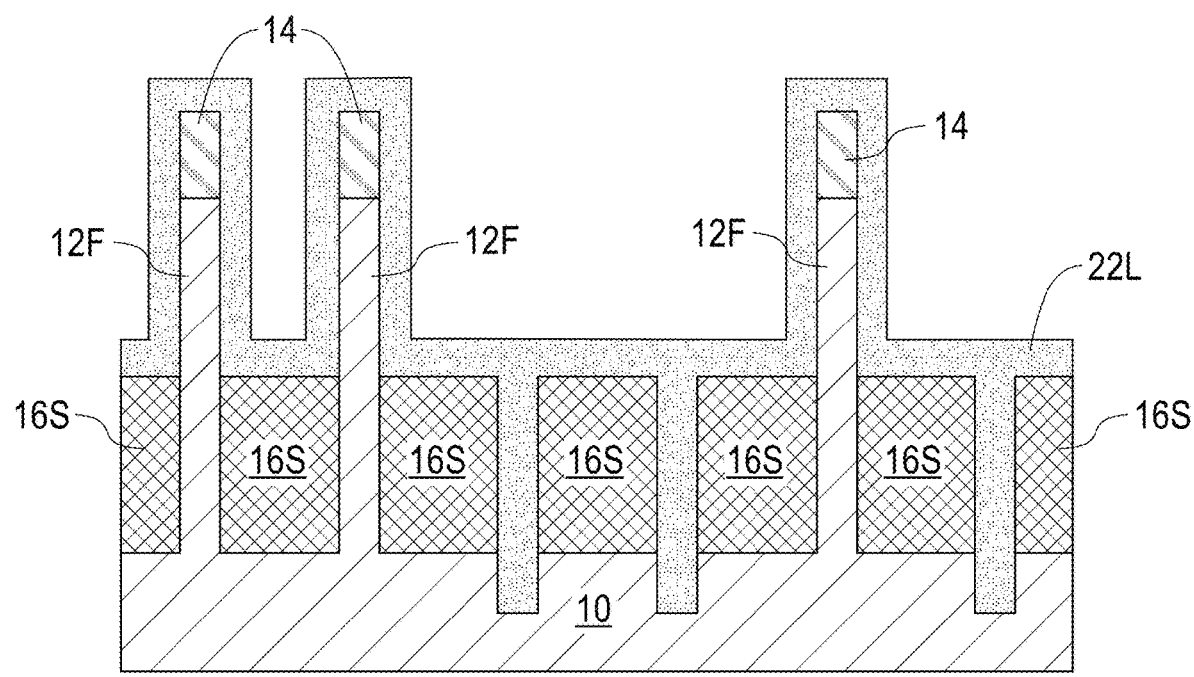
FIG. 6 is a cross sectional view of the exemplary semiconductor structure of FIG. 5 after forming a second dielectric material layer that is compositionally different from the first dielectric material layer.

Referring now to FIG. 6, there is illustrated the exemplary semiconductor structure of FIG. 5 after forming a second dielectric material layer 22L that is compositionally different from the first dielectric material layer 16L; the second dielectric material layer 22L is also compositionally different from the dielectric hard mask caps 14. As is illustrated, the second dielectric material layer 22L is formed on physically exposed surfaces of each dielectric pillar 16S, on physically exposed surfaces of each semiconductor fin 12F, on physically exposed surfaces of each dielectric hard mask cap 14 and within each gap 20. The second dielectric material layer 22L entirely fills each gap 20.

The second dielectric material layer 22L may be composed of silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), silicon oxide, or combinations thereof. In one example, the first dielectric material layer 16L is composed of silicon dioxide, while the second dielectric material layer 16L is composed of SiOCN.

The second dielectric material layer 22L can be formed utilizing a conformal deposition process such as, for example, chemical vapor deposition (CVD), plasma enhanced chemical vapor deposition (PECVD), or atomic layer deposition (ALD). The second dielectric material layer 22L is a continuous layer that conforms to the contour of the exemplary structure that it is deposited thereon. The second dielectric material layer 22L has a conformal thickness. The term "conformal" denotes that a material layer has a vertical thickness along horizontal surfaces that is substantially the same (i.e., within ±5%) as the lateral thickness along vertical surfaces.

In the present application, the second dielectric material layer 22L has a thickness that is equal to or greater than half of the original semiconductor fin 12 width. Thus, the second dielectric material layer 22L pinches off the gaps 20. In one example, and for semiconductor fins 12F having a width of 8 nm, gaps 20 can be pinched off by depositing a 5 nm thick second dielectric material layer 22L. In the present application, the second dielectric material layer 22L has a thickness that is less than half of the spacing between the original semiconductor fins 12F. Thus, the second dielectric material layer 22L is deposited on the exposed semiconductor fin 12F top and sidewalls, but does not completely fill the spacing between adjacent semiconductor fins 12F.

Figure 7:
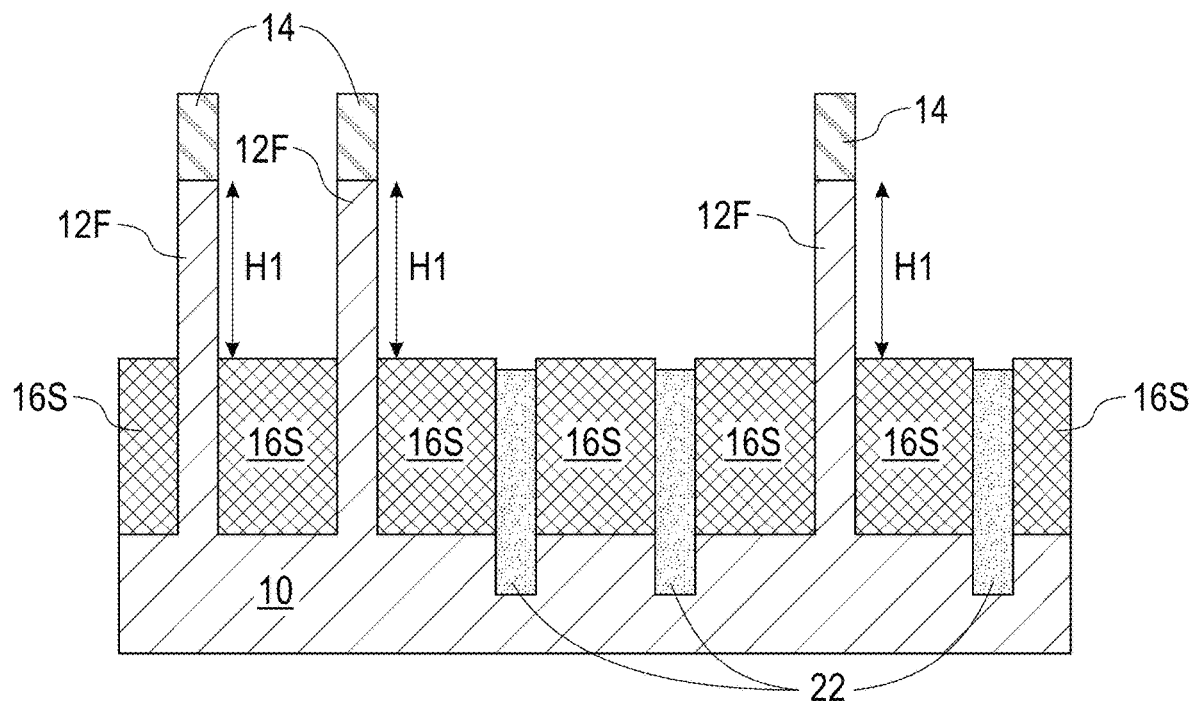
FIG. 7 is a cross sectional view of the exemplary semiconductor structure of FIG. 6 after removing the second dielectric material layer from around each dielectric hard mask capped semiconductor fin of the first set of semiconductor fins, while maintaining the second dielectric material layer within each gap.

Referring now to FIG. 7, there is illustrated the exemplary semiconductor structure of FIG. 6 after removing the second dielectric material layer 22L from around each dielectric hard mask cap semiconductor fin (14/12F), while maintaining the second dielectric material layer 22L within each gap 20. The removal is performed utilizing a recess etch that is isotropic (meaning removing material from all surfaces (horizontal and vertical) with the comparable rate). In some embodiments (and as is shown in FIG. 7), a slight recess of the second dielectric material layer 22L below the top surface of the dielectric pillar 16S, which is due to an over etch, occurs. The second dielectric material layer 22L that is maintained within each gap 20 may be referred to herein as a dielectric plug 22. Each dielectric plug 22 is located in the trench isolation region, Tiso, of the exemplary semiconductor structure of the present application, and is located laterally adjacent to a dielectric pillar 16S that is also present in the trench isolation region, Tiso. Collectively, the dielectric pillars 16S and the dielectric plug(s) 22 in the trench isolation region, Tiso, define a trench isolation structure of the present application. In accordance with the present application, a dielectric pillar 16S is located on each side of the at least one dielectric plug 22 that is present in the Tiso region.

The removal of the second dielectric material layer 22L from around each dielectric hard mask cap semiconductor fin (14/12F) may be performed utilizing an isotropic recess etching process that is selective in removing the dielectric material that provides the second dielectric material layer 22L. In some embodiments, the dielectric plugs 22 may have a topmost surface that is coplanar with each dielectric pillar 20S. In other embodiments, the dielectric plugs 22 may have a topmost surface that is non-coplanar with a topmost surface of the dielectric pillars 20S. For example, and as is illustrated in FIG. 7, the dielectric plugs 22 have a topmost surface that is vertically offset and located beneath a topmost surface of each dielectric pillar 20S. In another example, not shown, the dielectric plugs 22 may have a topmost surface that is vertically offset and located above a topmost surface of the each dielectric pillar 20S.

In the present application, the channel height, H1, of each semiconductor fin 12F is uniform, i.e., the same. The channel height represents the distance from the topmost surface of each dielectric pillar 20S to the topmost surface of the semiconductor fins 12F.

In the present application, each dielectric plug 16S has a first width and each dielectric pillar 22 has a second width that is less than the first width. The second width of each dielectric pillar is equal to a width of the removed semiconductor fin.

FIG. 7 shows an exemplary semiconductor structure that includes a plurality of semiconductor fins 12F extending upward from a surface of a semiconductor substrate 10, wherein each semiconductor fin 12F has a uniform channel height, H1. A trench isolation structure is located adjacent to the plurality of semiconductor fins 12F. The trench isolation structure includes at least one dielectric plug 22 having a second width and a dielectric pillar 16S having a first width located on each side of the at least one dielectric plug 22. In accordance with the present application, the second width of the at least one dielectric plug 22 is less than the first width of each dielectric pillar 16S, yet equal to a width of each semiconductor fin 12. Additional dielectric pillars 16S of the first width are present between each neighboring pair of semiconductor fins 12F in the different device regions. The additional dielectric pillars 16S and the dielectric pillar(s) 16S that is(are) located in the trench isolation region, Tiso, have a uniform height, and are composed of the first dielectric material.

Figure 8:
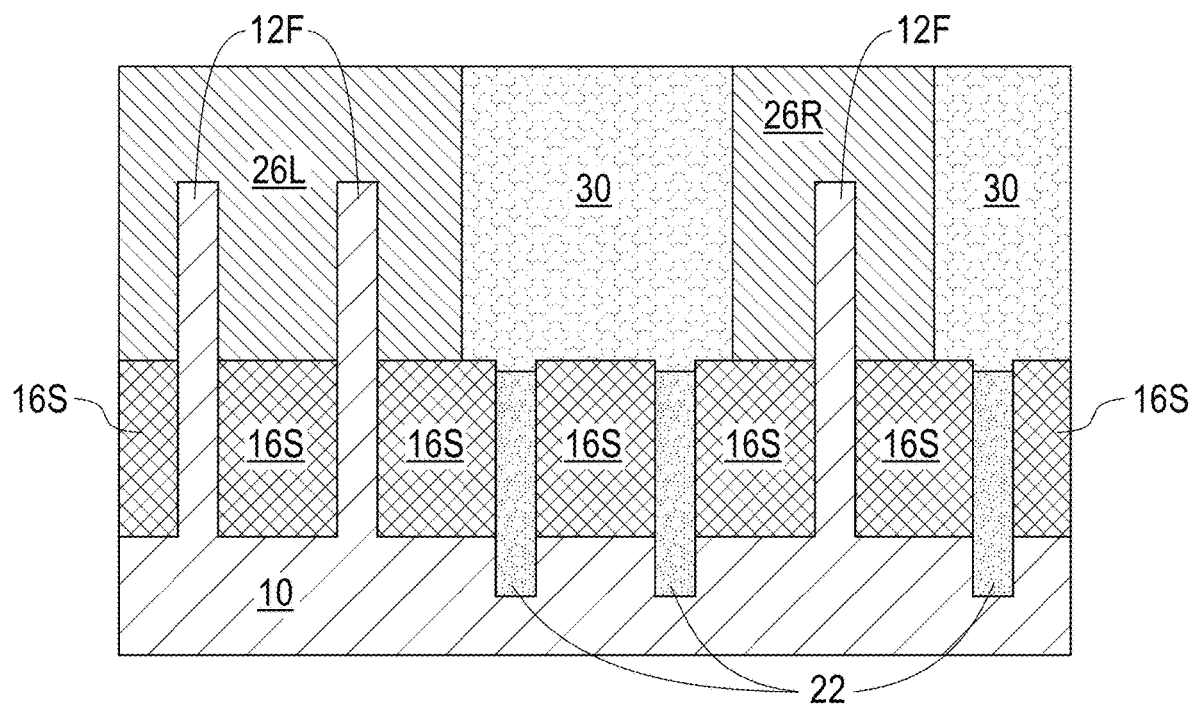
FIG. 8 is a cross sectional view of the exemplary semiconductor structure of FIG. 7 after performing further FinFET device processing including forming a functional gate structure and forming an interlayer dielectric material.

Referring now to FIG. 8, there is illustrated the exemplary semiconductor structure of FIG. 7 after performing further finFET device processing including forming a functional gate structure (26L, 26R), an interlayer dielectric (ILD) material 30. The ILD material 30 may be formed prior to, or after functional gate structure formation. In some embodiments, source/drain regions (not shown) are epitaxial grown from exposed portions of the semiconductor fin 12F not including the functional gate structure. The source/drain regions will be formed upon portions of the semiconductor fin 12F that come out from, and into the, page containing FIG. 8.

In some embodiments, and as is shown in FIG. 8, the dielectric hard mask caps 14 are removed from each semiconductor fin 12F to expose a topmost surface of the semiconductor fins 12F. In other embodiments, the dielectric hard mask caps 14 may remain on some, or all, of the semiconductor fins 12F. When the dielectric hard mask caps 14 are removed, the removal of the dielectric hard mask caps 14 may be performed utilizing an etching process or a planarization process such as, for example, CMP.

The ILD material 30, which is located above the trench isolation structure, is composed of a dielectric material such as, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. In one embodiment, the ILD material 30 can be formed by a deposition process such as, for example, chemical vapor deposition (CVD), plasma enhanced chemical vapor deposition (PECVD), evaporation or spin-on coating.

The term "functional gate structure denotes a permanent gate structure used to control output current (i.e., flow of carriers in the channel) of a semiconducting device through electrical or magnetic fields. Each functional gate structure that is formed straddles over a portion of at least one semiconductor fin 12F. In the illustrated embodiment, a first functional gate structure 26L straddles over the two semiconductor fins 12F in the first device region, D1, while a second functional gate structure 26R straddles over a portion of the single semiconductor fin 12F in the second device region, D2.

The first and second functional gate structures (26L, 26R) may be the same or different. For example, the first and second functional gate structures (26L, 26R) may be n-type FETs or p-type FETs. Alternatively, the first functional gate structure 26L is of a first conductivity type (i.e., one of n-type FET or p-type FET), while the second functional gate structure 26R is of a second conductivity type that is opposite from the first conductivity type.

Each functional gate structure (26L, 26R) includes a gate dielectric material layer and a gate electrode material. In some embodiments, a work function setting layer may be present between the gate dielectric material layer and the gate electrode material. The dielectric material layer is in direct physically contact with the channel region of each semiconductor fin 12F. The gate electrode material is present atop the gate dielectric material layer. The gate dielectric material, the optional work function setting layer, and the gate electrode material can be formed utilizing conventional deposition processes well known to those skilled in the art of FET fabrication.

The gate dielectric material layer can comprise any suitable dielectric material, including but not limited to, silicon oxide, silicon nitride, silicon oxynitride, high-k materials (i.e., a dielectric material having a dielectric constant of greater than 4.0), or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. The gate dielectric material layer can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric material layer has a thickness ranging from 1 nm to 5 nm, although less thickness and greater thickness are also conceived. In some embodiments, a multilayered gate dielectric structure comprising different gate dielectric materials, e.g., silicon dioxide, and a high-k gate dielectric, can be formed and used as the gate dielectric material layer.

The gate electrode material may be composed of a conductive material such as, for example, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g., Ti₃Al, ZrAl), TaC, TaMgC, carbon nanotube, conductive carbon, graphene, or any suitable combination of these materials. The conductive material may further comprise dopants that are incorporated during deposition.

In some embodiments, a work function setting layer may be formed between the gate dielectric material layer and the gate electrode material. When present, the work function setting layer is composed of any suitable work function metal (WFM) containing material. Illustrative examples of WFM containing materials that can be employed include, but are not limited to, a nitride, such as, for example, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), a carbide, such as, for example, titanium carbide (TiC), titanium aluminum carbide (TiAlC), tantalum carbide (TaC), hafnium carbide (HfC), and combinations thereof. In one embodiment, a first work function setting layer is provided to the first functional gate structure 24L that provides a first threshold voltage to the first functional gate structure, and a second work function setting layer is provided to the second functional gate structure 24R that provides a second threshold voltage to the second functional gate structure 24R that is different from the first threshold voltage. In one embodiment, the work function setting layer can have a thickness in a range from 20 nm to 50 nm. Other thicknesses that are lesser than, or greater than, the aforementioned thickness range can also be employed for the work function setting layer.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a plurality of semiconductor fins extending upward from a surface of a semiconductor substrate, wherein each semiconductor fin has a uniform channel height;
   a trench isolation structure located adjacent to the plurality of semiconductor fins, wherein the trench isolation structure comprises at least one dielectric plug having a second width and a dielectric pillar having a first width located on each side of the at least one dielectric plug, wherein the second width of the at least one dielectric plug is less than the first width of each dielectric pillar, yet equal to a width of each semiconductor fin, and wherein the at least one dielectric plug has a topmost surface that is vertically offset and is located beneath a topmost surface of each dielectric pillar of the trench isolation structure;
   a functional gate structure straddling a portion of each semiconductor fin; and
   an interlayer dielectric material located laterally adjacent to the functional gate structure and above the trench isolation structure; wherein the interlayer dielectric material directly contacts the topmost surface of the at least one of the dielectric plug and an upper sidewall of the dielectric pillar.

2. The semiconductor structure of claim 1, further comprising additional dielectric pillars of the first width located between each neighboring pair of semiconductor fins.

3. The semiconductor structure of claim 2, wherein each dielectric pillar of the trench isolation structure and the additional dielectric pillars have a uniform height, and are composed of a first dielectric material.

4. The semiconductor structure of claim 3, wherein the at least one dielectric plug is composed of a second dielectric material that is compositionally different from the first dielectric material.

5. The semiconductor structure of claim 4, wherein the first dielectric material is composed of silicon dioxide, and the second dielectric material is composed of SiOCN.

6. The semiconductor structure of claim 1, wherein the at least one dielectric plug extends beneath a topmost surface of the semiconductor substrate.

7. The semiconductor structure of claim 1, wherein a first number of the semiconductor fins are present in a first device region, and a second number of semiconductor fins are present in a second device region, and wherein the first and second device regions are separated by the trench isolation structure.

* * * * *